(12) United States Patent
Lin et al.

(10) Patent No.: US 11,705,514 B2
(45) Date of Patent: Jul. 18, 2023

(54) MOS TRANSISTOR STRUCTURE WITH HUMP-FREE EFFECT

(71) Applicant: MediaTek Inc., Hsin-Chu (TW)

(72) Inventors: Cheng Hua Lin, Hsinchu (TW); Yan-Liang Ji, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 256 days.

(21) Appl. No.: 15/138,683

(22) Filed: Apr. 26, 2016

(65) Prior Publication Data

US 2017/0033214 A1 Feb. 2, 2017

Related U.S. Application Data

(60) Provisional application No. 62/198,323, filed on Jul. 29, 2015.

(51) Int. Cl.
*H01L 29/78* (2006.01)
*H01L 29/06* (2006.01)
*H01L 29/10* (2006.01)
*H01L 29/08* (2006.01)

(52) U.S. Cl.
CPC ...... *H01L 29/7816* (2013.01); *H01L 29/0653* (2013.01); *H01L 29/0692* (2013.01); *H01L 29/0847* (2013.01); *H01L 29/0869* (2013.01); *H01L 29/0886* (2013.01); *H01L 29/1095* (2013.01); *H01L 29/78* (2013.01)

(58) Field of Classification Search
CPC ............. H01L 29/0653; H01L 29/0692; H01L 29/0847; H01L 29/0869; H01L 29/0886; H01L 29/1095; H01L 29/78; H01L 29/7816; H01L 29/0646
See application file for complete search history.

(56) References Cited

U.S. PATENT DOCUMENTS

| 5,930,612 | A | 7/1999 | Ito | |
|---|---|---|---|---|
| 6,573,533 | B1 * | 6/2003 | Yamazaki | H01L 29/78612 257/349 |
| 6,797,576 | B1 * | 9/2004 | Teng | H01L 21/26586 257/E21.345 |
| 2007/0228420 | A1 * | 10/2007 | Takano | H10B 69/00 257/E27.111 |
| 2010/0213545 | A1 | 8/2010 | Kho et al. | |
| 2012/0037995 | A1 * | 2/2012 | Kim | H01L 29/7833 257/E27.06 |
| 2013/0092987 | A1 | 4/2013 | Lopez | |

* cited by examiner

*Primary Examiner* — Mark W Tornow
*Assistant Examiner* — Priya M Rampersaud
(74) *Attorney, Agent, or Firm* — Wolf, Greenfield & Sacks, P.C.

(57) ABSTRACT

A MOS transistor structure is provided. The MOS transistor structure includes a semiconductor substrate having an active area including a first edge and a second edge opposite thereto. A gate layer is disposed on the active area of the semiconductor substrate and has a first edge extending across the first and second edges of the active area. A source region having a first conductivity type is in the active area at a side of the first edge of the gate layer and between the first and second edges of the active area. First and second heavily doped regions of a second conductivity type are in the active area adjacent to the first and second edges thereof, respectively, and spaced apart from each other by the source region.

13 Claims, 10 Drawing Sheets

MOS TRANSISTOR STRUCTURE WITH HUMP-FREE EFFECT

CROSS REFERENCE TO RELATED APPLICATIONS

This application claims the benefit of U.S. Provisional Application No. 62/198,323 filed on Jul. 29, 2015, the entirety of which is incorporated by reference herein.

BACKGROUND OF THE INVENTION

Field of the Invention

The present invention relates to a semiconductor device with a metal-oxide-semiconductor (MOS) transistor structure, and in particular to a MOS transistor structure with hump-free effect.

Description of the Related Art

High-voltage semiconductor technology is applied to integrated circuits (ICs) with high voltages and high power. In recent years, demands of high-voltage power integrated circuits (ICs) are increased. These power ICs typically include MOS transistors that are integrated therein. A typical MOS transistor used for a power IC includes an active area defined by a trench isolation structure, partially covered by a gate, and insulated from the gate by a gate insulator. Drain and source regions are formed in the active area and at both sides of the gate.

The thickness of the gate insulator near the edge of the gate that overlaps the source region and a portion of the trench isolation structure may be reduced. As a result, parasitic MOS transistors having a threshold voltage ($V_t$) smaller than that of the real MOS transistor are formed near such an edge of the gate. Such parasitic MOS transistors are sometimes referred to as low-$V_t$ transistors. The real MOS transistor is connected in parallel with the parasitic MOS transistors, so that sources of these MOS transistors are common, drains of these MOS transistors are common, and gates of these MOS transistors are common.

However, such a parasitic effect adversely affects the real MOS transistor characteristics. This effect is sometimes referred to as the "Hump effect" and results in an increase in the off-state current ($I_{off}$) of the real MOS transistor. The performance of the power IC is thus reduced.

Accordingly, a novel MOS transistor structure is desirable.

BRIEF SUMMARY OF THE INVENTION

A MOS transistor structure is provided. An exemplary embodiment of a MOS transistor structure includes a semiconductor substrate having an active area. The active area has a first edge and a second edge opposite thereto. The MOS transistor structure further includes a gate layer disposed on the active area of the semiconductor substrate and having a first edge extending across the first and second edges of the active area. The MOS transistor structure further includes a source region having a first conductivity type in the active area at a side of the first edge of the gate layer and between the first and second edges of the active area. The MOS transistor structure further includes first and second heavily doped regions of a second conductivity type in the active area adjacent to the first and second edges thereof, respectively, and spaced apart from each other by the source region.

Another exemplary embodiment of a MOS transistor structure includes a semiconductor substrate having an active area. The active area has a first edge and a second edge opposite thereto. The MOS transistor structure further includes a gate layer disposed on the active area of the semiconductor substrate and having a first edge extending across the first and second edges of the active area. The MOS transistor structure further includes a source region having a first conductivity type in the active area at a side of the first edge of the gate layer and between the first and second edges of the active area. The MOS transistor structure further includes first and second insulators in the active area adjacent to the first and second edges thereof, respectively, and spaced apart from each other by the source region.

Yet another exemplary embodiment of a MOS transistor structure includes a semiconductor substrate having an active area. The active area has a first edge and a second edge opposite thereto. The MOS transistor structure further includes a gate layer disposed on the active area of the semiconductor substrate and having a first edge extending across the first and second edges of the active area. The MOS transistor structure further includes a source region having a first conductivity type in the active area at a side of the first edge of the gate layer and between the first and second edges of the active area. The MOS transistor structure further includes first and second insulators covering the source region adjacent to the first and second edges of the active area, respectively, and spaced apart from each other to expose a portion of the source region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
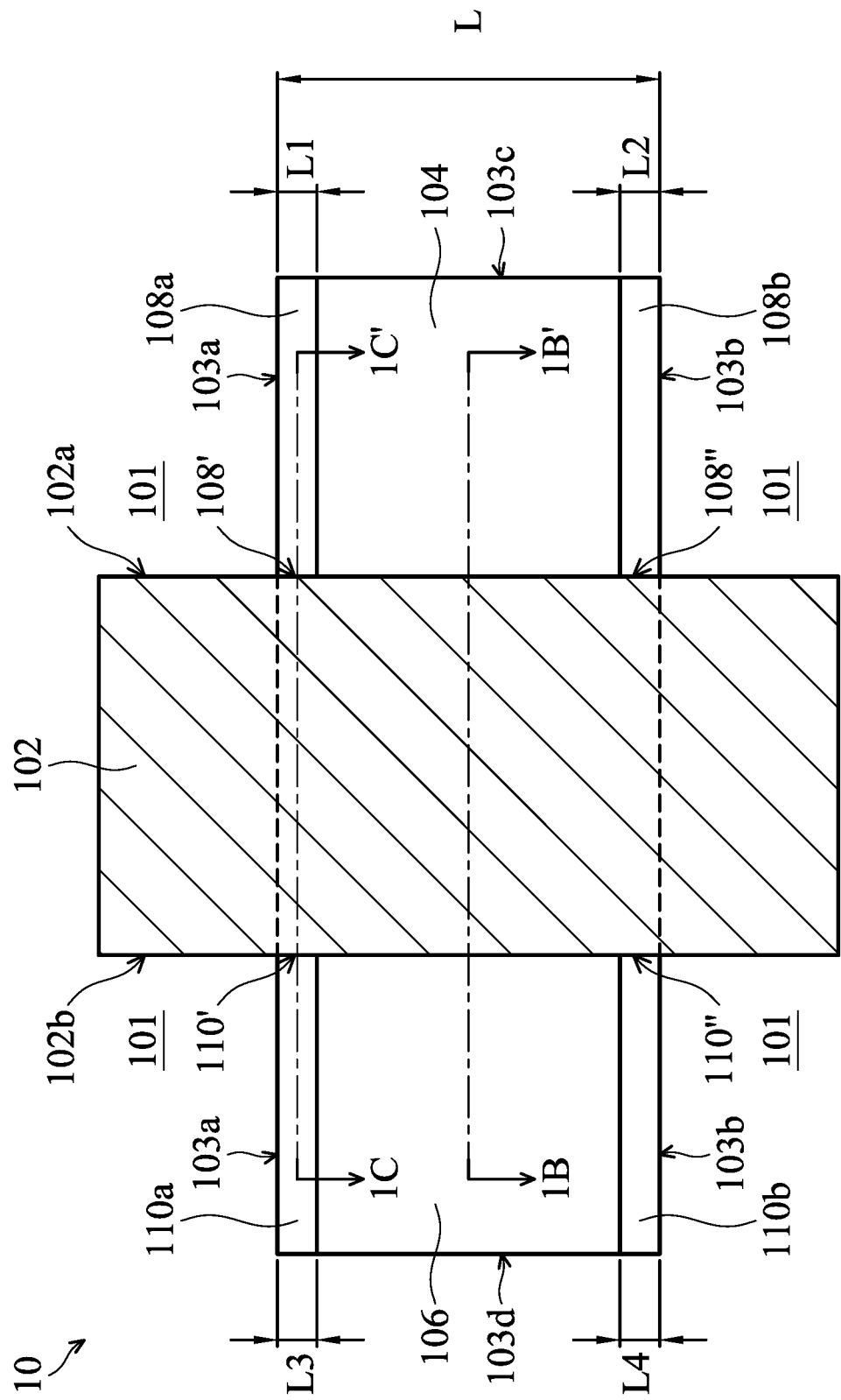
FIG. 1A is a plan view of a MOS transistor structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

Figure 1B:
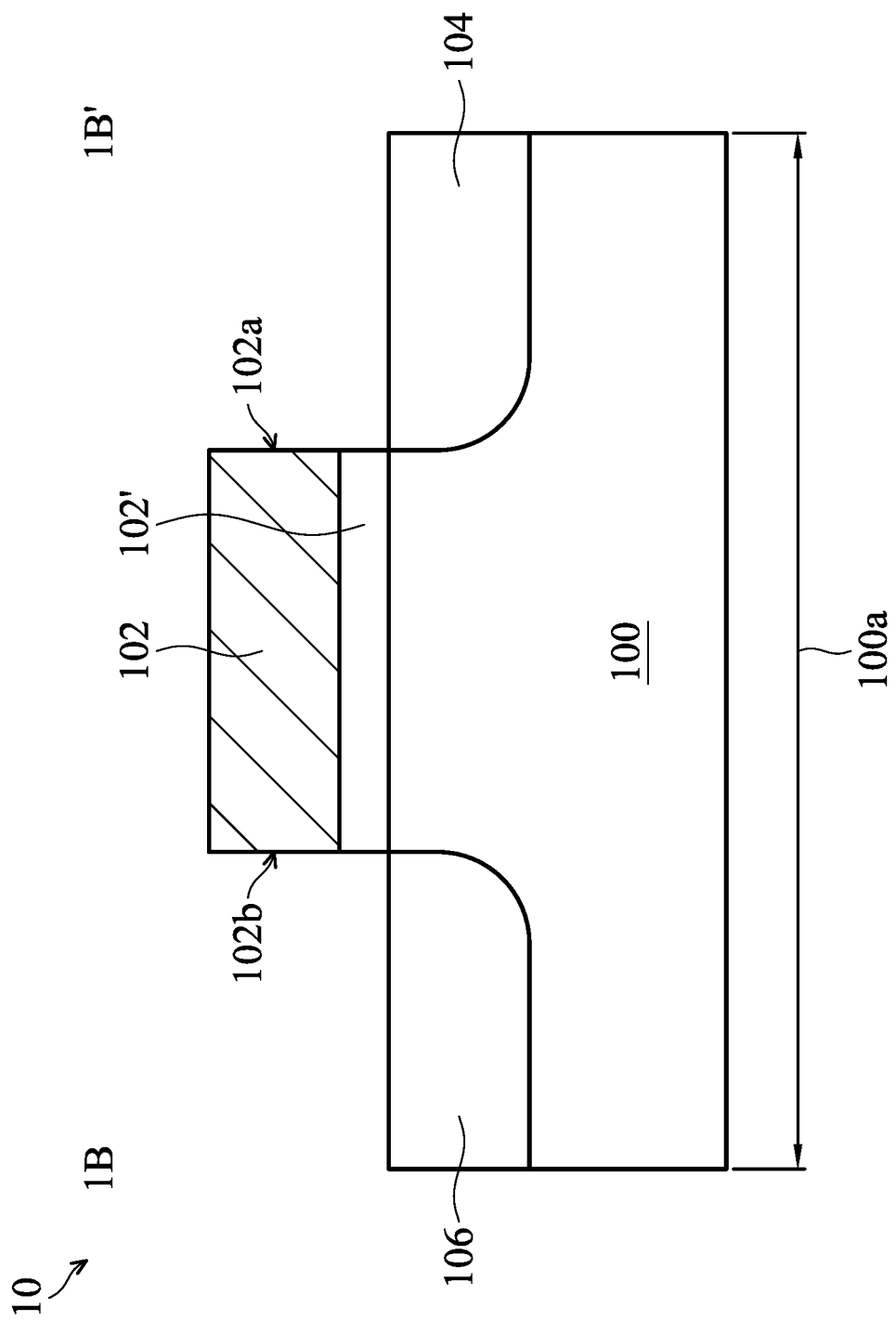
FIG. 1B is a cross-sectional view along line 1B-1B' shown in FIG. 1A.
Figure 1C:
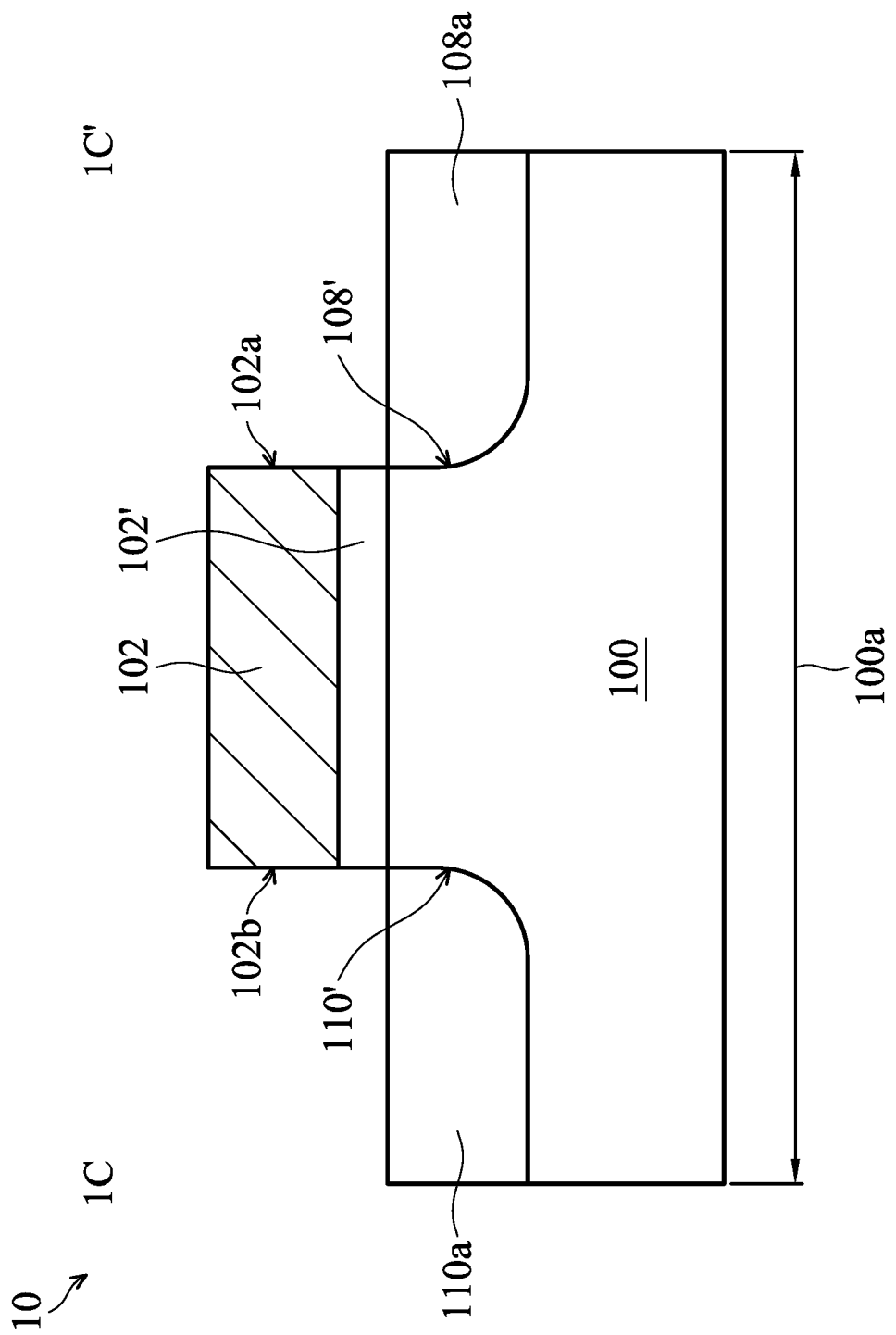
FIG. 1C is a cross-sectional view along line 1C-1C' shown in FIG. 1A.

Refer to FIGS. 1A to 1C, in which FIG. 1A illustrates a plan view of a MOS transistor structure 10 in accordance with some embodiments, FIG. 1B illustrates a cross-sectional view along line 1B-1B' shown in FIG. 1A, and FIG. 1C illustrates a cross-sectional view along line 1C-1C' shown in FIG. 1A. In the embodiment, the MOS transistor structure 10 includes a semiconductor substrate 100 having an active area 100a (as indicated in FIGS. 1B and 1C). The active area 100a has edges 103a-103d defined by an isolation structure 101 (as indicated in FIG. 1A). The edges 103a and 103b of the active area 100a are opposite to each other, and the edges 103c and 103d of the active area 100a are opposite to each other and connected between the edges 103a and 103b of the active area 100a.

In some embodiments, the semiconductor substrate 100 may comprise silicon, bulk semiconductor, compound semiconductor, silicon-on-insulator (SOI) or other well-known semiconductor substrate. The semiconductor substrate 100 may have a conductivity type, such as n-type or p-type. In some embodiments, the isolation structure 101 may comprise a shallow trench isolation (STI) structure. Alternatively, the isolation structure 101 may comprise a local oxidation of silicon (LOCOS) structure.

In the embodiment, the MOS transistor structure 10 further includes a gate structure that includes a gate layer 102 disposed on the active area 100a of the semiconductor substrate 100 and an underlying gate dielectric layer 102' contacting the active area 100a of the semiconductor substrate 100. In some embodiments, the gate structure may further include gate spacers disposed on the sidewalls of the gate layer 102. The gate layer 102 has first and second edges 102a and 102b opposite to each other. The first and second edges 102a and 102b extend across the edges 103a and 103b of the active area 100a and are spaced apart from the edges 103c and 103d of the active area 100a. The gate layer 102 may comprise metal, doped polysilicon, metal silicide or a combination thereof. Moreover, the gate dielectric layer 102' may comprise silicon oxide, silicon nitride, silicon carbide, silicon oxynitride, high-k dielectric material or other suitable dielectric materials.

In the embodiment, the MOS transistor structure 10 further includes a source region 104 and a drain region 106 formed in the active area 100a that have a conductivity type that is different from that of the semiconductor substrate 100. For example, the conductivity type of the source and drain regions 104 and 106 is n-type and the conductivity type of the semiconductor substrate 100 is p-type. Alternatively, the conductivity type of the source and drain regions 104 and 106 is p-type, and the conductivity type of the semiconductor substrate 100 is n-type. In the embodiment, the source region 104 is located at a side of the first edge 102a of the gate layer 102 and between the edges 103a and 103b of the active area 100a. Moreover, the drain region 106 is located at a side of the second edge 102b of the gate layer 102 and between the edges 103a and 103b of the active area 100a.

In the embodiment, the MOS transistor structure 10 further includes a first heavily doped region 108a, a second heavily doped region 108b, a third heavily doped region 110a, and a fourth heavily doped region 110b formed in the active area 100a. These heavily doped regions 108a, 108b, 110a, and 110b have the same conductivity type that is different from the conductivity type of the source and drain regions 104 and 106. For example, the conductivity type of these heavily doped regions 108a, 108b, 110a, and 110b is n-type, and the conductivity type of the source and drain regions 104 and 106 is p-type. Alternatively, the conductivity type of these heavily doped regions 108a, 108b, 110a, and 110b is p-type, and the conductivity type of the source and drain regions 104 and 106 is n-type. In some embodiments, these heavily doped regions 108a, 108b, 110a, and 110b may have a doping concentration substantially the same as that of the source and drain regions 104 and 106.

In the embodiment, the first heavily doped region 108a and the second heavily doped region 108b in the active area 100a are located at a side of the first edge 102a of the gate layer 102 and respectively adjacent to the edges 103a and 103b of the active area 100a. Moreover, the first heavily doped region 108a and the second heavily doped region 108b are spaced apart from each other by the source region 104. Additionally, the third heavily doped region 110a and the fourth heavily doped region 110b in the active area 100a are located at a side of the second edge 102b of the gate layer 102 and respectively adjacent to the edges 103a and 103b of the active area 100a. Moreover, the third heavily doped region 110a and the fourth heavily doped region 110b are spaced apart from each other by the drain region 106.

In the embodiment, the first heavily doped region 108a has an edge 108' and the second heavily doped region 108b has an edge 108", and the edges 108' and 108" are aligned with the first edge 102a of the gate layer 102. Moreover, the edge 108' of the first heavily doped region 108a has a length L1, the edge 108" of the second heavily doped region 108b has a length L2, and the edge 103c of the active area 100a has a length L. In some embodiments, the length ratio (L1/L) of the edge 108' of the first heavily doped region 108a to the edge 103c of the active area 100a is in a range of 2% to 5%. Similarly, the length ratio (L2/L) of the edge 108" of the second heavily doped region 108b to the edge 103c of the active area 100a is in a range of 2% to 5%. Note that the length ratios (i.e., L1/L and L2/L) should not be too high, so as to avoid the resistance of the source region 104 to be increased greatly.

In the embodiment, the third heavily doped region 110a has an edge 110' and the fourth heavily doped region 110b has an edge 110", and the edges 110' and 110' are aligned with the second edge 102b of the gate layer 102. Moreover, the edge 110' of the third heavily doped region 110a has a length L3, the edge 110" of the fourth heavily doped region 110b has a length L4, and the edge 103d of the active area 100a has a length L. In some embodiments, the length ratio (L3/L) of the edge 110' of the third heavily doped region 110a to the edge 103c or 103d of the active area 100a is in a range of 2% to 5%. Similarly, the length ratio (L4/L) of the edge 110" of the fourth heavily doped region 110b to the edge 103c or 103d of the active area 100a is in a range of 2% to 5%. Note that the length ratios (i.e., L3/L and L4/L) should not be too high, so as to avoid the resistance of the drain region 106 to be increased greatly.

Figure 2A:
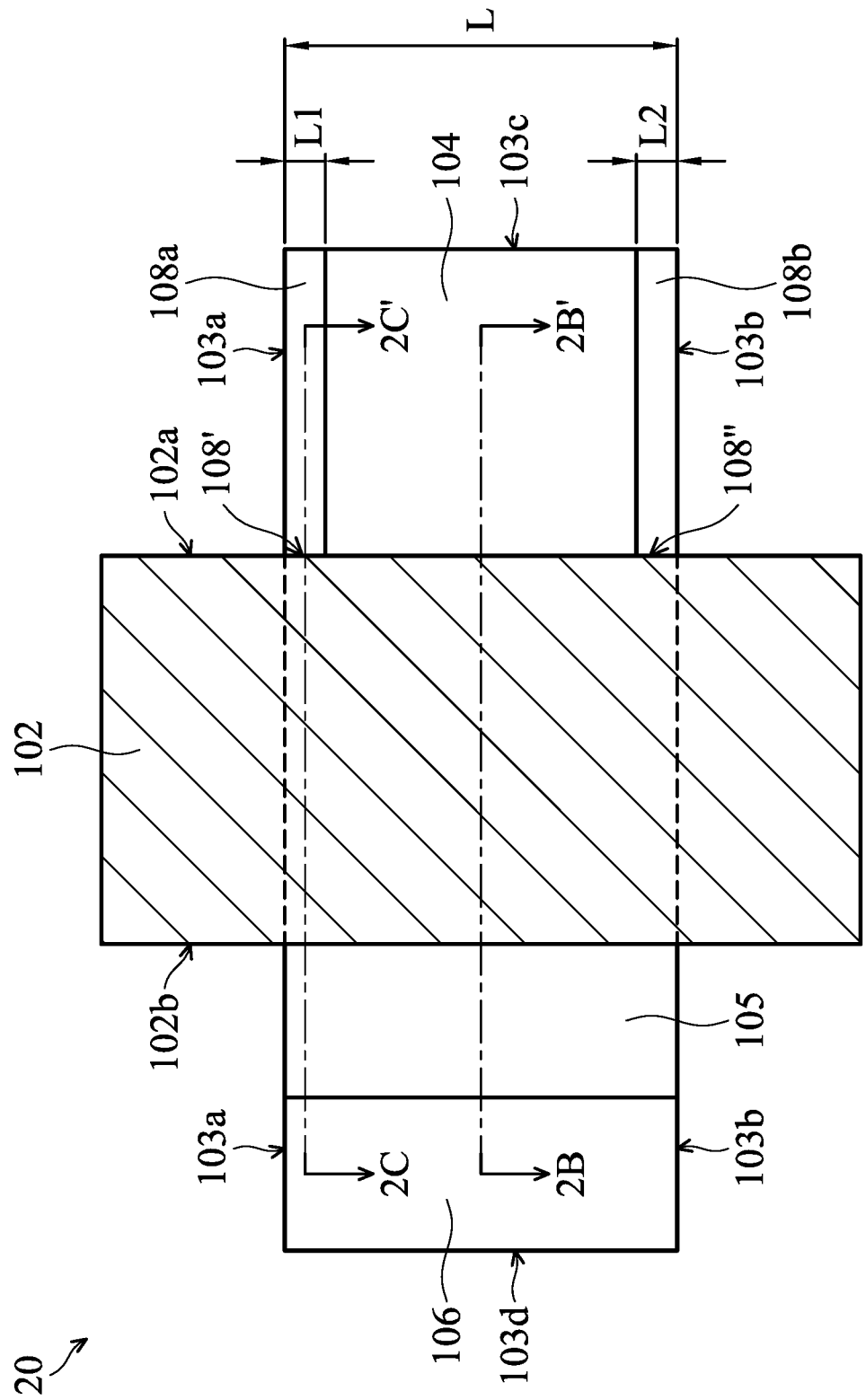
FIG. 2A is a plan view of a MOS transistor structure in accordance with some embodiments of the disclosure.
Figure 2B:
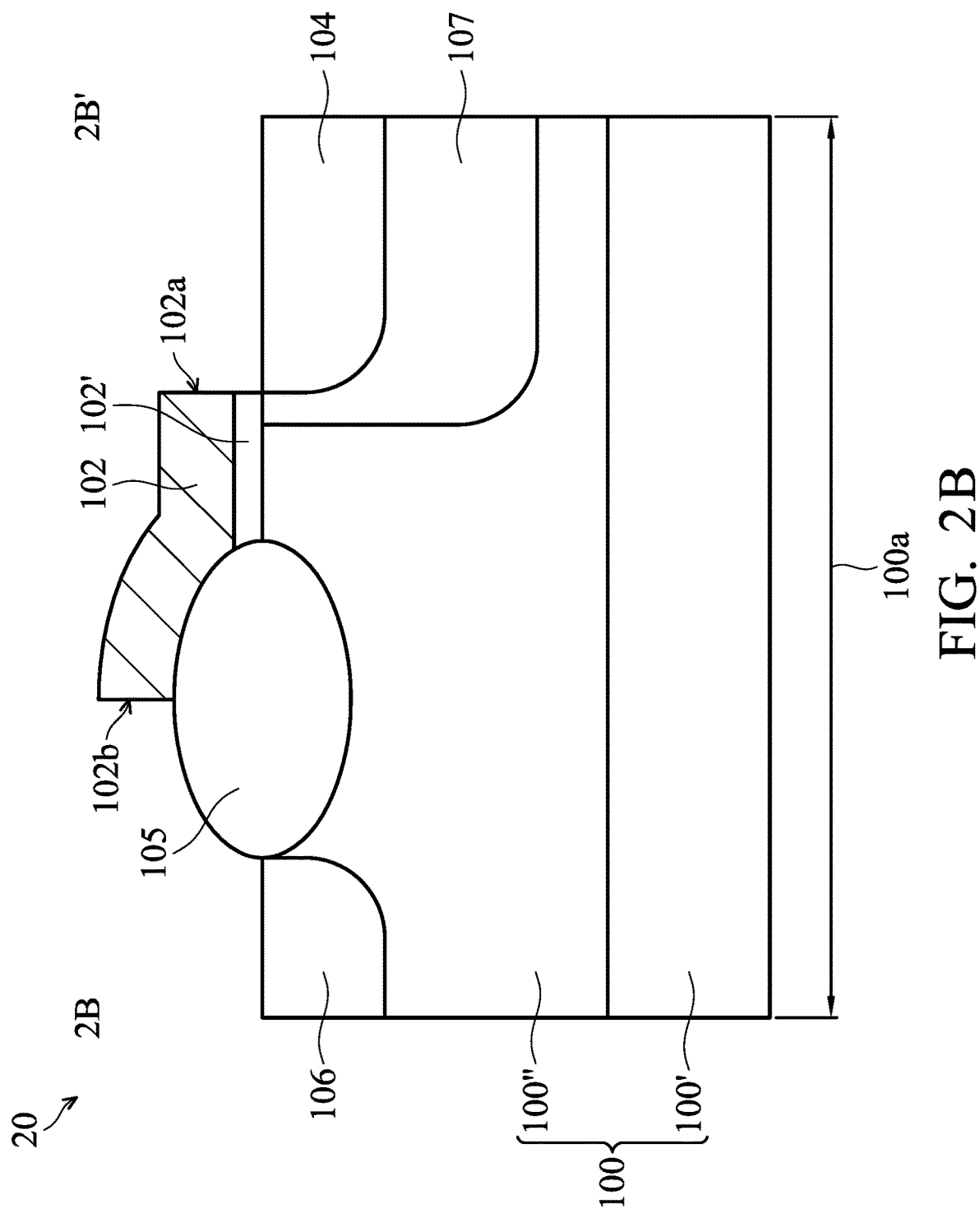
FIG. 2B is a cross-sectional view along line 2B-2B' shown in FIG. 2A.
Figure 2C:
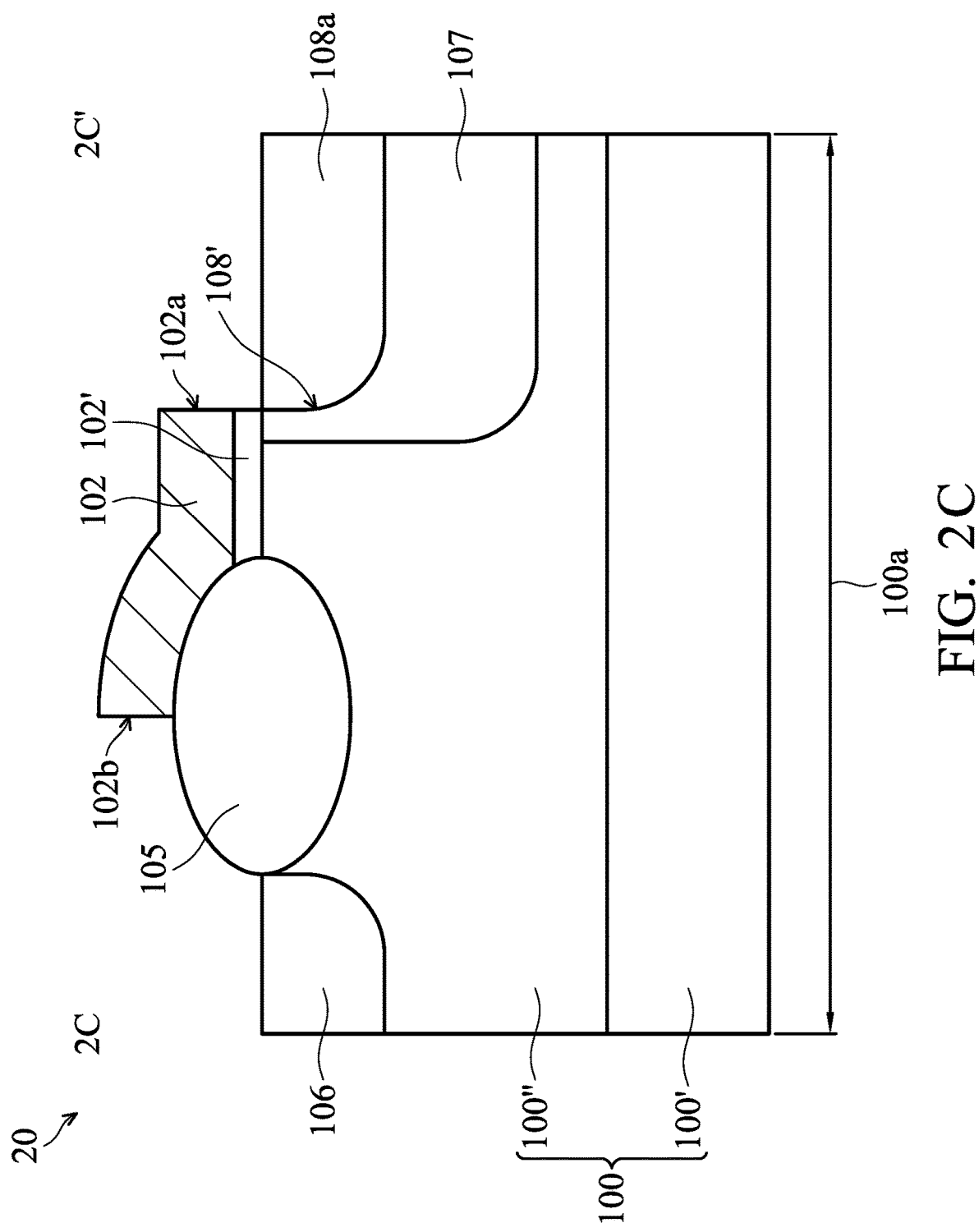
FIG. 2C is a cross-sectional view along line 2C-2C' shown in FIG. 2A.

Refer to FIGS. 2A to 2C, in which FIG. 2A illustrates a plan view of a MOS transistor structure 20 in accordance with some embodiments, FIG. 2B illustrates a cross-sectional view along line 2B-2B' shown in FIG. 2A, and FIG. 2C illustrates a cross-sectional view along line 2C-2C' shown in FIG. 2A. Descriptions of elements of the embodiments hereinafter that are the same as or similar to those previously described with reference to FIGS. 1A to 1C may be omitted for brevity. In the embodiment, the MOS transistor structure 20 may include a high-voltage MOS transistor, such as a laterally diffused MOS (LDMOS) transistor. In some embodiments, the MOS transistor structure 20 includes a semiconductor substrate 100 including a base 100' and an overlaying epitaxial layer 100" (as indicated in FIGS. 2B and 2C). The base 100' may comprise silicon, bulk semiconductor, compound semiconductor, or silicon-on-insulator (SOI) or other well-known semiconductor base. The epitaxial layer 100" may comprise silicon and be formed on the base 100' by a conventional epitaxial growth.

In the embodiment, the MOS transistor structure 20 further includes a field insulator 105, such as a field oxide (FOX), disposed in the epitaxial layer 100" corresponding to the active area 100a and partially covered by the gate layer 102. In the embodiment, the field insulator 105 may comprise an STI structure. Alternatively, the field insulator 105 may comprise an LOCOS structure. Moreover, the drain region 106 that is formed in the epitaxial layer 100" corresponding to the active area 100a is spaced apart from the gate layer 102 by the field insulator 105.

Moreover, the MOS transistor structure 20 further includes a body region 107 disposed in the epitaxial layer 100" corresponding to the active area 100a, and spaced apart from the field insulator 105. Also, the source region 104, the first and second heavily doped regions 108a and 108b are formed in the epitaxial layer 100" corresponding to the active area 100a and spaced apart from the field insulator 105. The body region 107 is sometimes referred to as a well region, and the source region 104 and the first and second heavily doped regions 108a and 108b are located in the body region 107. Moreover, the body region 107 has a conductivity type that is the same as the first and second heavily doped regions 108a and 108b and has a doping concentration that is lower than that of the first and second heavily doped regions 108a and 108b. Unlike the MOS transistor structure 10 shown in FIGS. 1A to 1C, there are not third and fourth heavily doped regions 110a and 110b formed in the active area 100a of the MOS transistor structure 20.

Figure 3A:
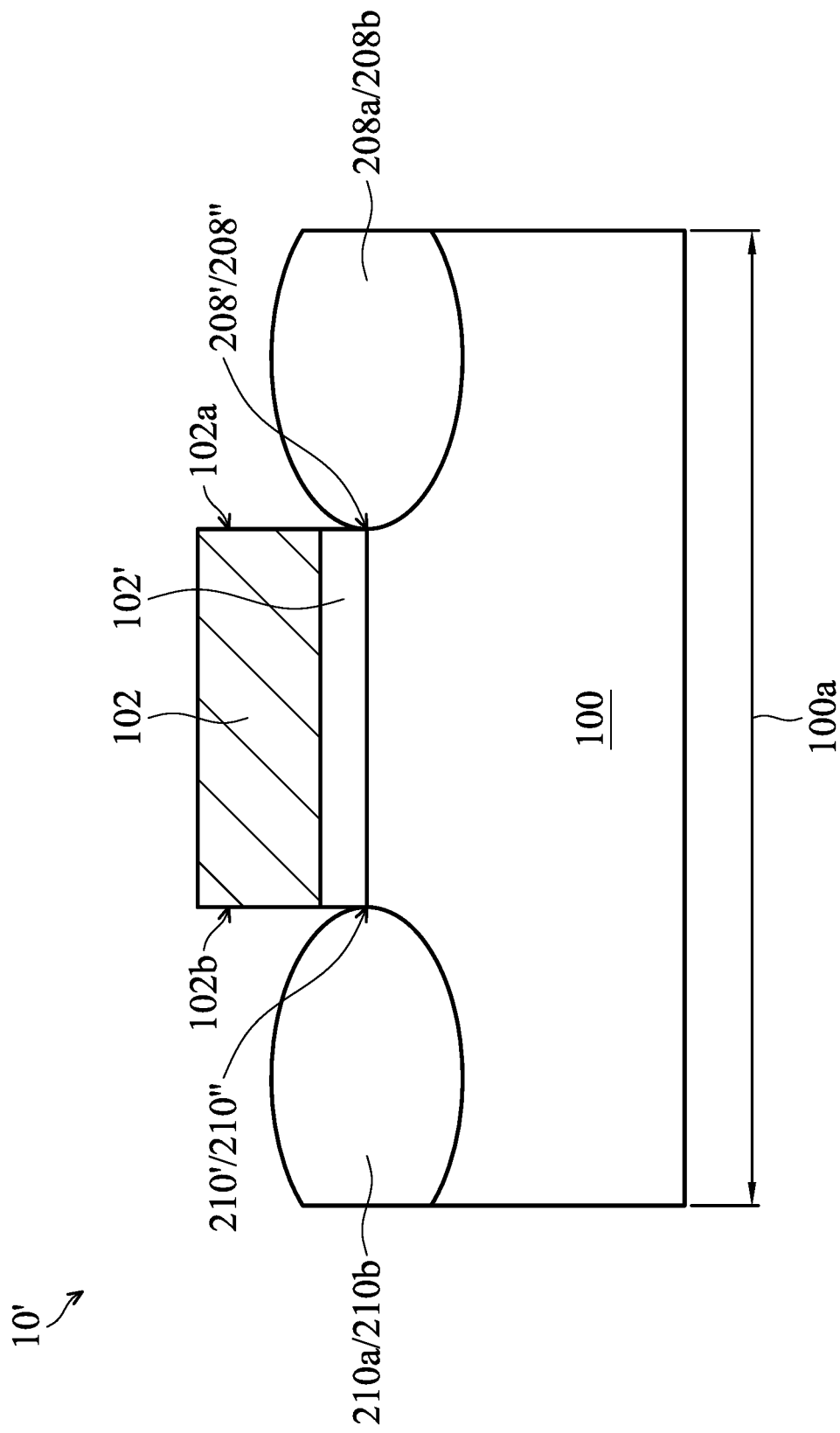
FIG. 3A is a cross-sectional view of a MOS transistor structure in accordance with some embodiments of the disclosure.

Refer to FIG. 3A, which illustrates a cross-sectional view of a MOS transistor structure 10' in accordance with some embodiments. Descriptions of elements of the embodiments hereinafter that are the same as or similar to those previously described with reference to FIGS. 1A to 1C may be omitted for brevity. In the embodiment, the MOS transistor structure 10' is similar to the MOS transistor structure 10 shown in FIGS. 1A to 1C. However, in the MOS transistor structure 10', there are not first, second, third, and fourth heavily doped regions 108a, 108b, 110a, and 110b formed in the semiconductor substrate 100 corresponding to the active area 100a. In the embodiment, the MOS transistor structure 10' includes a first insulator 208a, a second insulator 208b, a third insulator 210a, and a fourth insulator 210b formed in the active area 100a and respectively having the same location as those of the first, second, third, and fourth heavily doped regions 108a, 108b, 110a, and 110b of the MOS transistor structure 10 shown in FIG. 1A. In some embodiments, these insulators 208a, 208b, 210a, and 210b may comprise a filed oxide and be formed by deposition or thermal growth or other suitable depositions.

As shown in FIGS. 1A and 3A, in the embodiment, the first insulator 208a and the second insulator 208b in the active area 100a are located at a side of the first edge 102a of the gate layer 102 and respectively adjacent to the edges 103a and 103b (as indicated in FIG. 1A) of the active area 100a. Moreover, the first insulator 208a and the second insulator 208b are spaced apart from each other by the source region 104 (as indicated in FIG. 1A). Additionally, the third insulator 210a and the fourth insulator 210b in the active area 100a are located at a side of the second edge 102b of the gate layer 102 and respectively adjacent to the edges 103a and 103b of the active area 100a. Moreover, the third insulator 210a and the fourth insulator 210b are spaced apart from each other by the drain region 106 (as indicated in FIG. 1A).

In the embodiment, the first insulator 208a has an edge 208' and the second insulator 208b has an edge 208", and the edges 208' and 208" are aligned with the first edge 102a of the gate layer 102. Moreover, the edge 208' of the first insulator 208a has a length L1 (as indicated in FIG. 1A), the edge 208" of the second insulator 208b has a length L2 (as indicated in FIG. 1A), and the edge 103c (as indicated in FIG. 1A) of the active area 100a has a length L (as indicated in FIG. 1A). In some embodiments, the length ratio (L1/L) of the edge 208' of the first insulator 208a to the edge 103c of the active area 100a is in a range of 2% to 5%. Similarly, the length ratio (L2/L) of the edge 208" of the second insulator 208b to the edge 103c of the active area 100a is in a range of 2% to 5%. Note that the length ratios (i.e., L1/L and L2/L) should not be too high, so as to avoid the resistance of the source region 104 to be increased greatly.

In the embodiment, the third insulator 210a has an edge 210' and the fourth insulator 210b has an edge 210", and the edges 210' and 210" are aligned with the second edge 102b of the gate layer 102. Moreover, the edge 210' of the third insulator 210a has a length L3 (as indicated in FIG. 1A), the edge 110" of the fourth insulator 210b has a length L4 (as indicated in FIG. 1A), and the edge 103d (as indicated in FIG. 1A) of the active area 100a has a length L. In some embodiments, the length ratio (L3/L) of the edge 210' of the third insulator 208a to the edge 103c or 103d of the active area 100a is in a range of 2% to 5%. Similarly, the length ratio (L4/L) of the edge 208" of the fourth insulator 208b to the edge 103c or 103d of the active area 100a is in a range of 2% to 5%. Note that the length ratios (i.e., L3/L and L4/L) should not be too high, so as to avoid the resistance of the drain region 106 to be increased greatly.

Figure 3B:
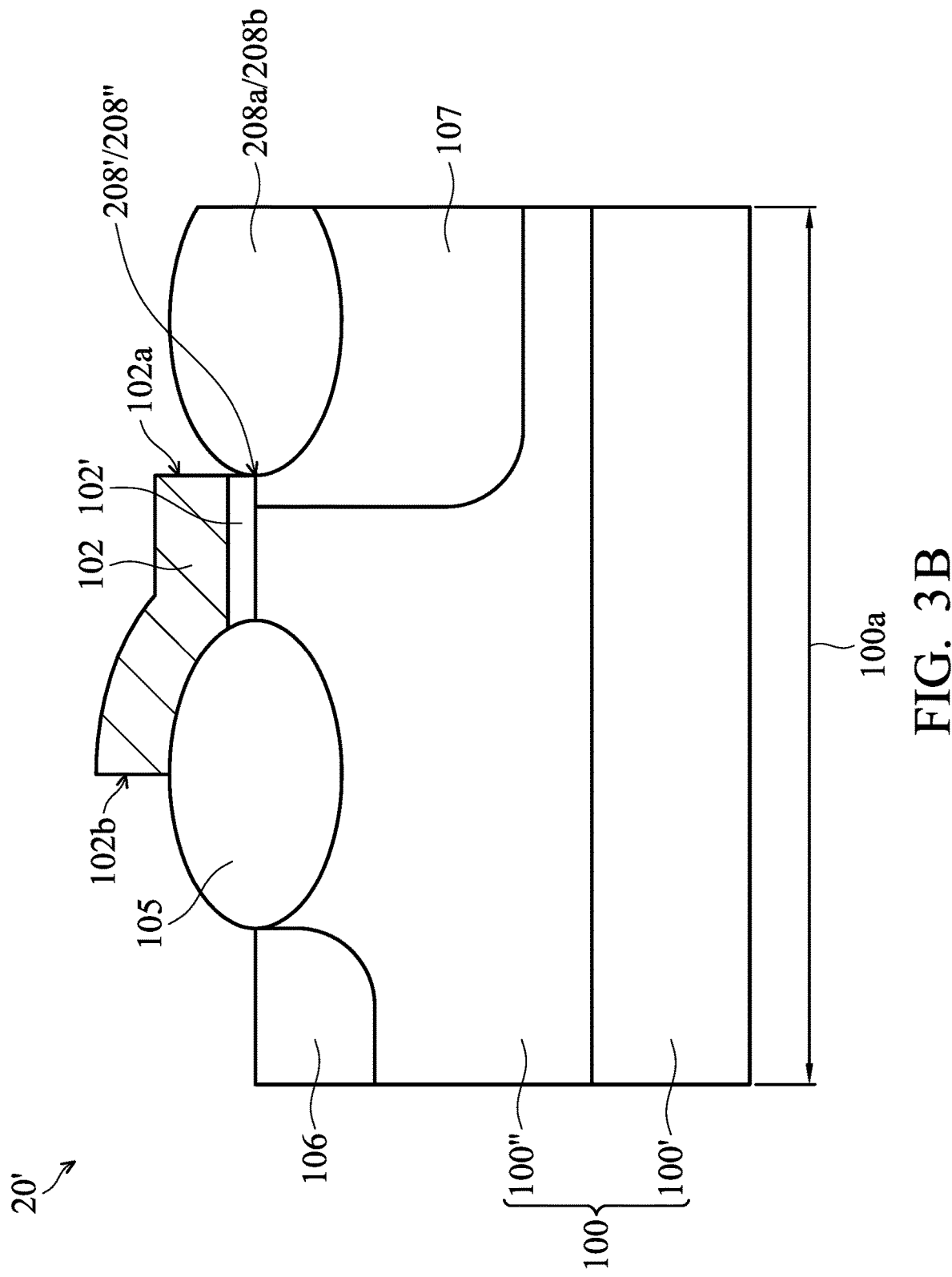
FIG. 3B is a cross-sectional view of a MOS transistor structure in accordance with some embodiments of the disclosure.

Refer to FIG. 3B, which illustrates a cross-sectional view of a MOS transistor structure 20' in accordance with some embodiments. Descriptions of elements of the embodiments hereinafter that are the same as or similar to those previously described with reference to FIGS. 2A to 2C may be omitted for brevity. In the embodiment, the MOS transistor structure 20' is similar to the MOS transistor structure 20 shown in FIGS. 2A to 2C. However, in the MOS transistor structure 20', there are not first and second heavily doped regions 108a and 108b formed in the epitaxial layer 100" of the semiconductor substrate 100. In the embodiment, the MOS transistor structure 20' includes a first insulator 208a and a second insulator 208b formed in the epitaxial layer 100" corresponding to an active area 100a and respectively having the same location as those of the first and second heavily doped regions 108a and 108b of the MOS transistor structure 20 shown in FIG. 2A. In some embodiments, these insulators 208a and 208b may comprise a filed oxide and be formed by deposition or thermal growth or other suitable depositions.

As shown in FIGS. 2A and 3B, in the embodiment, the first insulator 208a and the second insulator 208b in the active area 100a are located at a side of the first edge 102a of the gate layer 102 and respectively adjacent to the edges 103a and 103b (as indicated in FIG. 2A) of the active area 100a. Moreover, the first insulator 208a and the second insulator 208b are spaced apart from each other by the source region 104 (as indicated in FIG. 2A).

In the embodiment, the first insulator 208a has an edge 208' and the second insulator 208b has an edge 208", and the edges 208' and 208" are aligned with the first edge 102a of the gate layer 102. Moreover, the edge 208' of the first insulator 208a has a length L1 (as indicated in FIG. 2A), the edge 208" of the second insulator 208b has a length L2 (as indicated in FIG. 2A), and the edge 103c (as indicated in FIG. 2A) of the active area 100a has a length L (as indicated in FIG. 1A). In some embodiments, the length ratio (L1/L) of the edge 208' of the first insulator 208a to the edge 103c of the active area 100a is in a range of 2% to 5%. Similarly, the length ratio (L2/L) of the edge 208" of the second insulator 208b to the edge 103c of the active area 100a is in a range of 2% to 5%.

Figure 4A:
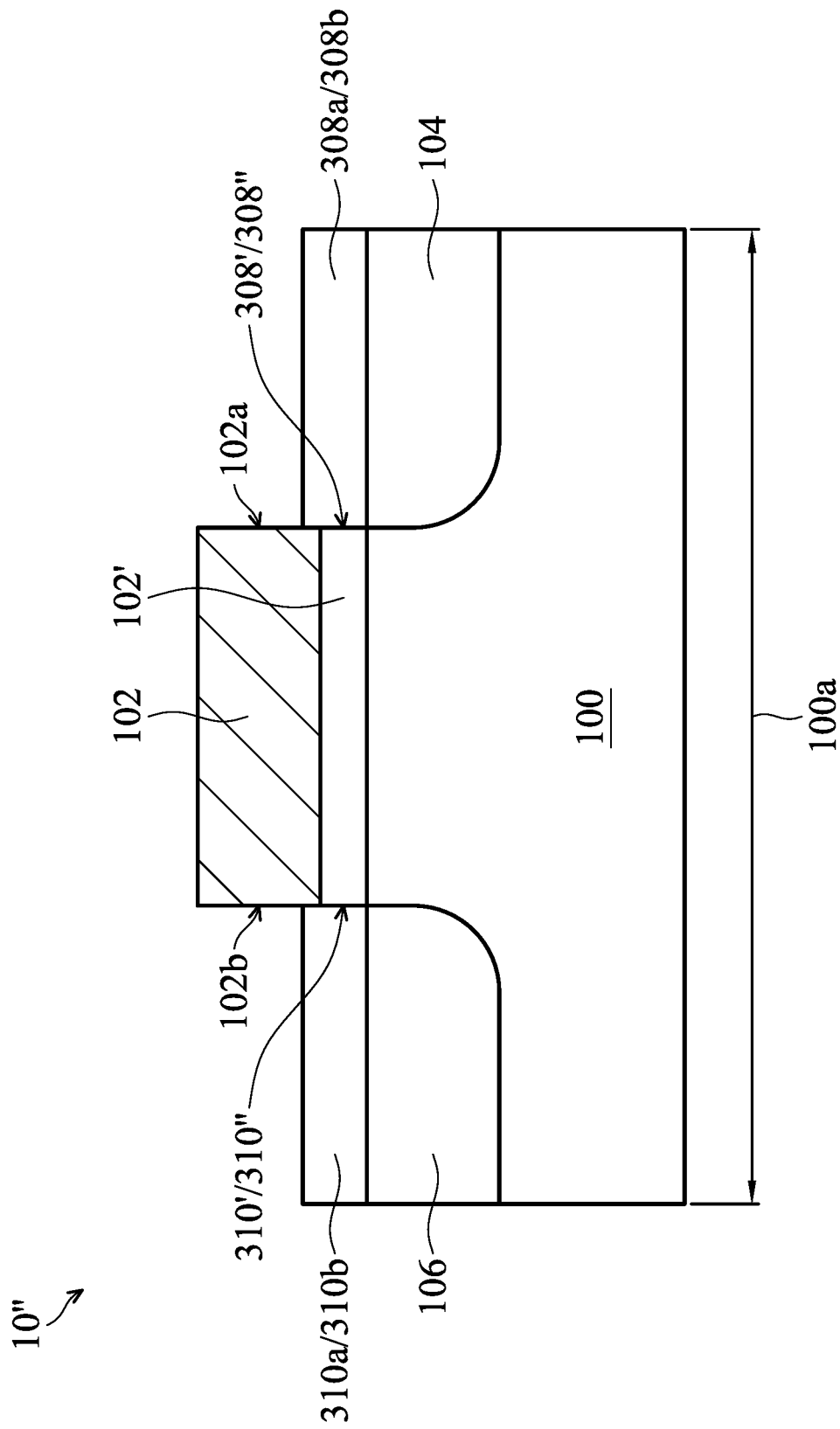
FIG. 4A is a cross-sectional view of a MOS transistor structure in accordance with some embodiments of the disclosure.

Refer to FIG. 4A, which illustrates a cross-sectional view of a MOS transistor structure 10" in accordance with some embodiments. Descriptions of elements of the embodiments hereinafter that are the same as or similar to those previously described with reference to FIGS. 1A to 1C may be omitted for brevity. In the embodiment, the MOS transistor structure 10" is similar to the MOS transistor structure 10 shown in FIGS. 1A to 1C. However, in the MOS transistor structure 10", there are not first, second, third, and fourth heavily doped regions 108a, 108b, 110a, and 110b formed in the semiconductor substrate 100 corresponding to the active area 100a. In the embodiment, the MOS transistor structure 10' includes first and second insulators 308a and 308b partially covering the source region 104, respectively. Moreover, third and fourth insulators 310a and 310b partially covering the drain region 106, respectively. These insulators 308a, 308b, 310a, and 310b respectively having the same location as those of the first, second, third, and fourth heavily doped regions 108a, 108b, 110a, and 110b of the MOS transistor structure 10 shown in FIG. 1A. In some embodiments, these insulators 308a, 308b, 310a, and 310b may comprise an oxide layer and serve as a self-aligned silicide (salicide) block layer (which is sometimes referred to as a resist protective oxide (RPO)).

As shown in FIGS. 1A and 4A, in the embodiment, the first insulator 308a and the second insulator 308b are located at a side of the first edge 102a of the gate layer 102 and respectively covering the source region 104 adjacent to the edges 103a and 103b (as indicated in FIG. 1A) of the active area 100a. Moreover, the first insulator 308a and the second insulator 308b are spaced apart from each other to expose a portion of the source region 104 (as indicated in FIG. 1A). Additionally, the third insulator 310a and the fourth insulator 310b are located at a side of the second edge 102b of the gate layer 102 and respectively covering the drain region 106 adjacent to the edges 103a and 103b of the active area 100a. Moreover, the third insulator 310a and the fourth insulator 310b are spaced apart from each other to expose a portion of the drain region 106 (as indicated in FIG. 1A).

In the embodiment, the first insulator 308a has an edge 308' and the second insulator 308b has an edge 308", and the edges 308' and 308" are aligned with the first edge 102a of the gate layer 102. Moreover, the edge 308' of the first insulator 308a has a length L1 (as indicated in FIG. 1A), the edge 308" of the second insulator 308b has a length L2 (as indicated in FIG. 1A), and the edge 103c (as indicated in FIG. 1A) of the active area 100a has a length L (as indicated in FIG. 1A). In some embodiments, the length ratio (L1/L) of the edge 308' of the first insulator 308a to the edge 103c of the active area 100a is in a range of 2% to 5%. Similarly, the length ratio (L2/L) of the edge 308" of the second insulator 308b to the edge 103c of the active area 100a is in a range of 2% to 5%. Note that the length ratios (i.e., L1/L and L2/L) should not be too high, so as to avoid the resistance of the source region 104 to be increased greatly.

In the embodiment, the third insulator 310a has an edge 310' and the fourth insulator 310b has an edge 310", and the edges 310' and 310" are aligned with the second edge 102b of the gate layer 102. Moreover, the edge 310' of the third insulator 210a has a length L3 (as indicated in FIG. 1A), the edge 310" of the fourth insulator 310b has a length L4 (as indicated in FIG. 1A), and the edge 103d (as indicated in FIG. 1A) of the active area 100a has a length L. In some embodiments, the length ratio (L3/L) of the edge 310' of the third insulator 308a to the edge 103c or 103d of the active area 100a is in a range of 2% to 5%. Similarly, the length ratio (L4/L) of the edge 308" of the fourth insulator 308b to the edge 103c or 103d of the active area 100a is in a range of 2% to 5%. Note that the length ratios (i.e., L3/L and L4/L) should not be too high, so as to avoid the resistance of the drain region 106 to be increased greatly.

Figure 4B:
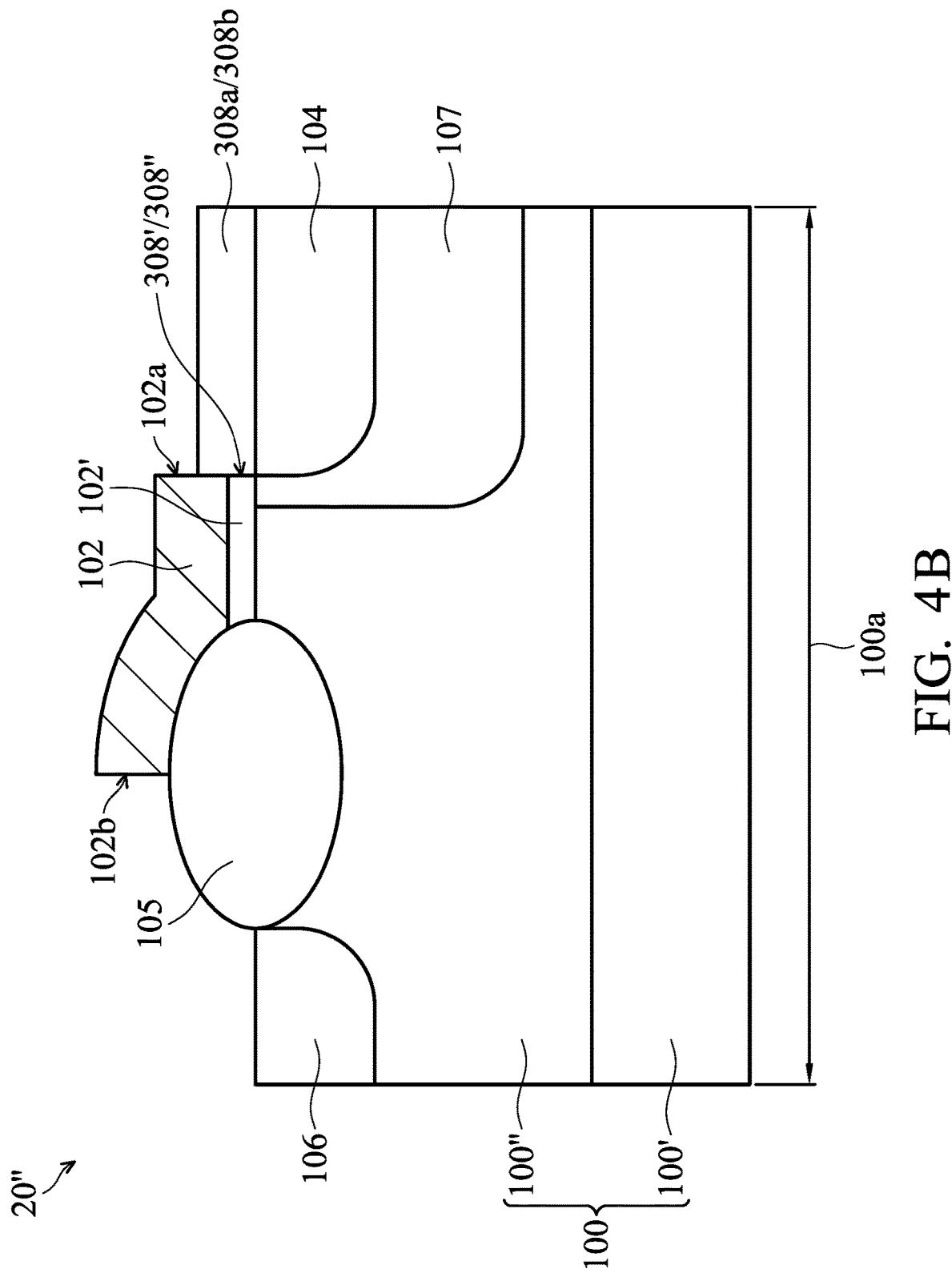
FIG. 4B is a cross-sectional view of a MOS transistor structure in accordance with some embodiments of the disclosure.

Refer to FIG. 4B, which illustrates a cross-sectional view of a MOS transistor structure 20" in accordance with some embodiments. Descriptions of elements of the embodiments hereinafter that are the same as or similar to those previously described with reference to FIGS. 2A to 2C may be omitted for brevity. In the embodiment, the MOS transistor structure 20" is similar to the MOS transistor structure 20 shown in FIGS. 2A to 2C. However, in the MOS transistor structure 20", there are not first and second heavily doped regions 108a and 108b formed in the epitaxial layer 100" of the semiconductor substrate 100. In the embodiment, the MOS transistor structure 20" includes a first insulator 308a and a second insulator 308b formed in the epitaxial layer 100" corresponding to active area 100a and respectively having the same location as those of the first and second heavily doped regions 108a and 108b of the MOS transistor structure 20 shown in FIG. 2A. In some embodiments, these insulators 308a and 308b may an oxide layer and serve as a salicide block layer (which is sometimes referred to as an RPO).

As shown in FIGS. 2A and 4B, in the embodiment, the first insulator 308a and the second insulator 308b in the active area 100a are located at a side of the first edge 102a of the gate layer 102 and respectively covering the source region 104 adjacent to the edges 103a and 103b (as indicated in FIG. 2A) of the active area 100a. Moreover, the first insulator 308a and the second insulator 308b are spaced apart from each other to expose a portion of the source region 104 (as indicated in FIG. 2A).

In the embodiment, the first insulator 308a has an edge 308' and the second insulator 308b has an edge 308", and the edges 308' and 308" are aligned with the first edge 102a of the gate layer 102. Moreover, the edge 308' of the first insulator 308a has a length L1 (as indicated in FIG. 2A), the edge 308" of the second insulator 308b has a length L2 (as indicated in FIG. 2A), and the edge 103c (as indicated in FIG. 2A) of the active area 100a has a length L (as indicated in FIG. 1A). In some embodiments, the length ratio (L1/L) of the edge 308' of the first insulator 308a to the edge 103c of the active area 100a is in a range of 2% to 5%. Similarly, the length ratio (L2/L) of the edge 308" of the second insulator 308b to the edge 103c of the active area 100a is in a range of 2% to 5%.

According to the foregoing embodiments, since the formation of heavily doping regions in the active area of the MOS transistor can prevent the formation of parasitic MOS transistors that is connected in parallel with the real MOS transistor, the Hump effect can be eliminated or mitigated. As a result, the performance of the power IC is thus improved. Additionally, since there is no need to provide an extra implant mask for the formation of these heavily doping regions, the process steps are not increased or changed and the manufacturing cost is not increased.

Similarly, the formation of insulators (e.g., field oxides) in the active area of the MOS transistor to separate the source region or both of the source and drain regions from the isolation structure that is used for defining the active area of the MOS transistor can also prevent the formation of parasitic MOS transistors. Accordingly, the Hump effect can be eliminated or mitigated.

Moreover, the formation of insulators (e.g., silicide block layers) partially covering the source region or both of the source and drain regions of the MOS transistor may increase the resistance of the source region or both of the source and drain regions under these insulators, so that the current passing through the source/drain region under these insulators is reduced. As a result, the Hump effect can also be mitigated.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A MOS transistor for power integrated circuits (ICs), comprising:
    a semiconductor substrate having an active area, wherein the active area has a first edge and a second edge opposite thereto;
    a gate layer disposed on the active area of the semiconductor substrate and having a first edge and a second edge opposite thereto, extending across the first and second edges of the active area;
    first and second heavily doped regions of a first conductivity type in the active area at opposite sides of the gate layer and between the first and second edges of the active area; and
    first and second heavily doped regions of a second conductivity type in the active area directly physically contacting the first and second heavily doped regions of the first conductivity type respectively, wherein
        the first and second heavily doped regions of the second conductivity type have respective edges, and
        the edges of the first and second heavily doped regions of the second conductivity type are coplanar with the first and second edges of the gate layer respectively.

2. The MOS transistor of claim 1, wherein:
    the active area has a third edge connected to the first and second edges thereof, and
    a length ratio of the edge of the first heavily doped region of the second conductivity type to the third edge of the active area is in a range of 2% to 5%.

3. The MOS transistor of claim 1, wherein:
    the active area has a fourth edge connected to the first and second edges thereof, and
    a length ratio of the edge of the second heavily doped region of the second conductivity type to the fourth edge of the active area is in a range of 2% to 5%.

4. The MOS transistor of claim 1, wherein the first conductivity type is n-type and the second conductivity type is p-type.

5. The MOS transistor of claim 1, wherein the first conductivity type is p-type and the second conductivity type is n-type.

6. The MOS transistor of claim 1, comprising
    a third heavily doped region of the second conductivity type in the active area adjacent to the first heavily doped region of the first conductivity type and separate from the first heavily doped region of the second conductivity type by the first heavily doped region of the first conductivity type, and
    the third heavily doped region of the second conductivity type has an edge overlapping with the first edge of the gate layer.

7. The MOS transistor of claim 6, wherein:
    the active area has a third edge connected to the first and second edges thereof, and
    a length ratio of the edge of the first or third heavily doped region of the second conductivity type to the third edge of the active area is in a range of 2% to 5%.

8. The MOS transistor of claim 1, further comprising:
    a fourth heavily doped region of the second conductivity type in the active area adjacent to the second heavily doped region of the first conductivity type and separate from the second heavily doped region of the second conductivity type by the second heavily doped region of the first conductivity type.

9. The MOS transistor of claim 8, wherein each of the second and fourth heavily doped regions of the second conductivity type has an edge overlapping with the second edge of the gate layer.

10. The MOS transistor of claim 8, wherein:
    the active area has a fourth edge connected to the first and second edges thereof, and
    a length ratio of the edge of the second or fourth heavily doped region of the second conductivity type to the fourth edge of the active area is in a range of 2% to 5%.

11. The MOS transistor of claim 1, wherein:
    the MOS transistor is formed without a dedicated implant mask for the formation of the first and second heavily doped regions of a second conductivity type.

12. The MOS transistor of claim 1, wherein:
    the first heavily doped region of the second conductivity type separates the first heavily doped region of the first conductivity type from an isolation structure.

13. The MOS transistor of claim 12, wherein:
    the second heavily doped region of the second conductivity type separates the second heavily doped region of the first conductivity type from the isolation structure.

* * * * *